(12) United States Patent
Tatehara et al.

(10) Patent No.: US 6,717,968 B2
(45) Date of Patent: Apr. 6, 2004

(54) LASER DRIVE DEVICE

(75) Inventors: Kenichi Tatehara, Osaka (JP); Kiyoshi Nakamori, Osaka (JP); Toshiya Akagi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/303,831

(22) Filed: Nov. 26, 2002

(65) Prior Publication Data

US 2003/0086456 A1 May 8, 2003

Related U.S. Application Data

(63) Continuation of application No. 09/717,141, filed on Nov. 22, 2000, now Pat. No. 6,490,301.

(30) Foreign Application Priority Data

Nov. 30, 1999 (JP) ............................................ 11-339092

(51) Int. Cl.$^7$ ................................................. H01S 3/10
(52) U.S. Cl. .............................. 372/33; 372/34; 372/31
(58) Field of Search ................................ 372/38.02, 31, 372/38, 38.01, 29, 34, 33; 315/151, 149; 327/563, 65, 66, 67; 330/253, 254, 252, 71; 363/225, 65, 21

(56) References Cited

U.S. PATENT DOCUMENTS

| | | |
|---|---|---|
| 4,639,684 A | 1/1987 | Laude |
| 4,709,370 A | 11/1987 | Bednarz et al. |
| 4,745,610 A * | 5/1988 | Yoshikawa ................ 372/38.02 |
| 4,967,417 A * | 10/1990 | Yamada .................. 372/29.015 |
| 5,191,589 A | 3/1993 | Amano et al. |
| 5,521,809 A | 5/1996 | Ashley et al. |
| 5,536,934 A | 7/1996 | Hayashi |
| 5,557,238 A | 9/1996 | Weiss |
| 5,563,898 A | 10/1996 | Ikeuchi et al. |
| 5,606,282 A | 2/1997 | Yoshida |
| 5,638,390 A | 6/1997 | Gilliland et al. |
| 5,696,657 A * | 12/1997 | Nourrcier et al. .......... 361/93.8 |
| 5,734,668 A | 3/1998 | Raven et al. |
| 5,736,844 A * | 4/1998 | Yanagisawa ................ 323/282 |

(List continued on next page.)

FOREIGN PATENT DOCUMENTS

| | | |
|---|---|---|
| JP | 07-095610 | 10/1995 |
| JP | 10-65239 | 10/1998 |
| JP | 10-163556 | 10/1998 |
| JP | 2000-244052 | 9/2000 |

*Primary Examiner*—Carl Whitehead, Jr.
*Assistant Examiner*—Laura M Schillinger
(74) *Attorney, Agent, or Firm*—McDermott, Will & Emery

(57) ABSTRACT

The laser drive device of this invention includes a laser, first and second current sources, a current amplifier, and first and second transistors. When the first transistor is OFF, a first current from the first current source is supplied to the current amplifier, where the current is amplified to generate a laser current to be supplied to the laser. Thus, the laser is turned ON. During this time, the second transistor is ON, allowing a second current to flow from a power supply node into the second current source. When the first transistor is ON, the entire or part of the first current flows into the second current source through the first transistor. This reduces the current supplied to the current amplifier and thus the laser current, resulting in turning OFF the laser. During this time, the second transistor is OFF. The values of the first and second currents are determined by a set current value. The value of the laser current supplied to the laser during the ON-state of it is determined by the first current. Therefore, by adjusting the set current value, a desired value of laser current can be supplied to the laser. Having the current amplifier, the values of the first and second currents are smaller than the value of the laser current. This suppresses an increase in power consumed by the first and second power sources and the first and second transistors when the laser current increases.

4 Claims, 9 Drawing Sheets

U.S. PATENT DOCUMENTS

| | | | | |
|---|---|---|---|---|
| 5,742,133 A | * | 4/1998 | Wilhelm et al. | 315/291 |
| 5,883,910 A | * | 3/1999 | Link | 372/38.07 |
| 5,966,395 A | * | 10/1999 | Ikeda | 372/38.01 |
| 6,051,967 A | | 4/2000 | Draaijer | |
| 6,087,899 A | * | 7/2000 | Kubota | 330/253 |
| 6,097,159 A | * | 8/2000 | Mogi et al. | 315/151 |
| 6,249,178 B1 | * | 6/2001 | Umeda | 327/563 |
| 6,490,301 B1 | * | 12/2002 | Tatehara et al. | 372/33 |
| 6,563,848 B1 | * | 5/2003 | Iwazaki | 372/38.02 |

* cited by examiner

LASER DRIVE DEVICE

BACKGROUND OF THE INVENTION

The present invention relates to a laser drive device.

With the recent trend toward larger-capacity and higher-speed optical disk devices, demands for laser drive devices with high speed and low power consumption have increased for data recording/reproduction for such optical disk devices.

As an example of conventional laser drive devices intending to increase the switching speed, Japanese Patent Publication No. 7-95610 discloses a laser drive device as shown in FIG. 9.

In the conventional laser drive device, an inflow-current I5A flowing into an inflow-current source 5 and a set current I5B flowing from an outflow-current source 6 are set based on a set current I4 flowing from a current setting circuit 4. An outflow-current I6 flowing from the outflow-current source 6 is set based on the set current I5B. Recording signals reverse to each other are applied to bases of transistors 3A and 3B of a differential current switch 3. When the transistor 3A is turned ON and the transistor 3B is turned OFF, a current value of a current I3A flowing through the transistor 3A becomes equal to that of the inflow-current I5A and the outflow-current I6. As a result, a value of a laser current I1 becomes zero, thereby turning OFF a laser 1. When the transistor 3A is turned OFF and the transistor 3B is turned ON, a current value of a current I3B flowing through the transistor 3B is made equal to that of the inflow-current I5A, while a current value of the current I3A flowing through the transistor 3A becomes zero. As a result, a current value of the laser current I1 becomes equal to that of the outflow-current I6, thereby turning ON the laser 1.

The above mentioned conventional laser drive device satisfies desirable conditions for driving a laser, where the laser 1 is grounded on one side and is connected to the transistor 3A as a switching element in a collector follower manner on the other side. Moreover, while satisfying the above conditions, the transistor 3A as the switching element is made of an NPN transistor having a high switching speed. This enables easy attainment of a switching speed as high as several nanoseconds or less.

The conventional laser drive device shown in FIG. 9 however has the following problem.

In general, in a laser drive device of data recording/reproduction for an optical disk device, the values of a laser current vary among the operations of reading, erasing, and writing. The current value is large during writing, while it is small during reading.

In the illustrated conventional laser drive device, the laser current I1 itself is turned ON/OFF by the differential current switch 3. Therefore, as the laser current I1 is greater, power consumption of the laser drive device increases.

As the laser current I1 is smaller, the currents flowing into the transistors 3A and 3B of the differential current switch 3 decrease, resulting in reducing the switching speed of the transistors 3A and 3B.

SUMMARY OF THE INVENTION

An object of the present invention is providing a laser drive device capable of suppressing increases in power consumption even on an increase in laser current.

Another object of the present invention provides a laser drive device suppressing decline in switching speed even on decrease in laser current.

The laser drive device of the present invention includes a laser, a first current source, a second current source, a current amplifier, a first transistor, and a second transistor. The first current source supplies a first current having a current value associated with a set current value. The second current source receives a second current having a current value associated with the set current value. The current amplifier amplifies a current from the first current source to generate a laser current and supplies the laser current to the laser. The first transistor is connected between the first current source and the second current source. The second transistor is connected between a power supply node receiving a power supply voltage and the second current source. The first and second transistors are turned ON/OFF complementarily.

In the above laser drive device, when the first transistor is OFF, a first current from the first current source is supplied to the current amplifier. The current amplifier amplifies the current supplied from the first current source to generate a laser current. The laser current is then supplied to the laser. Thus, the laser is turned ON. During this time, the second transistor is ON, allowing a second current to flow from a power supply node into the second current source through the second transistor. When the first transistor is ON, the entire or part of the first current flows into the second current source through the first transistor. This reduces the current supplied to the current amplifier and thus reduces the laser current, resulting in turning OFF the laser. During this time, the second transistor is OFF. The values of the first and second currents are determined by a set current value. The value of the laser current supplied to the laser during the ON-state of it is determined by the value of the first current. Therefore, by adjusting the set current value, a desired value of laser current can be supplied to the laser.

Since the laser drive device is provided with the current amplifier, the values of the first and second currents are smaller than the value of the laser current. This suppresses an increase in power consumed by the first and second power sources and the first and second transistors.

Preferably, the anode of the laser is connected to the power supply node, and the current amplifier includes first, second, and third NPN transistors. The first NPN transistor is connected between the first current source and a grounding node receiving a grounding potential with the emitter being grounded. The second NPN transistor has a collector connected to the power supply node, an emitter connected to the base of the first NPN transistor, and a base connected to the collector of the first NPN transistor. The third NPN transistor is connected between the cathode of the laser and the grounding node with the emitter being grounded. The base of it is connected to the base of the first NPN transistor.

Preferably, the current amplifier further includes a plurality of fourth NPN transistors connected between the cathode of the laser and the grounding node in parallel with the third NPN transistor with the emitters being grounded. The bases of the fourth NPN transistors are connected to the base of the first NPN transistor.

In the above laser drive device, the first, second, and third NPN transistors make a current mirror circuit. The current from the first current source flows through the first NPN transistor. A current of a value obtained by multiplying the current flowing through the first NPN transistor by the mirror ratio flows through the third NPN transistor, to be supplied to the laser as the laser current.

Further, the first and second NPN transistors and each of the plurality of fourth NPN transistors make a current mirror circuit. The sum of the currents flowing through the respective fourth NPN transistors and the current flowing through the third NPN transistor is supplied to the laser as the laser current.

Preferably, the anode of the laser is connected to the power supply node, and the current amplifier includes first, second, and third n-channel MOS transistors. The first n-channel MOS transistor is connected between the first current source and a grounding node receiving grounding potential. The second n-channel MOS transistor is connected between the power supply node and the gate of the first n-channel MOS transistor. The gate of the second n-channel MOS transistor is connected to the first current source. The third n-cannel MOS transistor is connected between the cathode of the laser and the grounding node. The gate of the third n-channel MOS transistor is connected to the gate of the first n-channel MOS transistor.

Preferably, the current amplifier further includes a plurality of fourth n-channel MOS transistors connected between the cathode of the laser and the grounding node in parallel with the third n-channel MOS transistor. The gates of the fourth n-channel MOS transistors are connected to the gate of the first n-channel MOS transistor.

In the above laser drive device, the first, second, and third n-channel MOS transistors make a current mirror circuit. The current from the first current source flows through the first NPN transistor. A current of a value obtained by multiplying the current flowing through the first NPN transistor by the mirror ratio flows through the third NPN transistor, to be supplied to the laser as the laser current.

Further, the first and second n-channel MOS transistors and each of the plurality of fourth n-channel MOS transistors make a current mirror circuit. The sum of the currents flowing through the respective fourth n-channel MOS transistors and the current flowing through the third n-channel MOS transistor is supplied to the laser as the laser current.

Preferably, the above laser drive device further includes a third current source connected to a node interconnecting the first transistor and the second current source for receiving a third current.

In the above laser drive device, when the first transistor is OFF, the second transistor is ON, allowing the sum of the second and third currents to flow through the second transistor. The second current flows into the second current source while the third current flows into the third current source. When the first transistor is ON, the second transistor is OFF, allowing the entire or part of the first current from the first current source to flow through the first transistor. This current is equal to the sum of the second and third currents, where the second current flows into the second current source while the third current flows into the third current source.

Overall, as the value of a current flowing through a transistor is smaller, the switching speed of the transistor is lower. In the above laser drive device, as the value of the laser current supplied to the laser is smaller, the value of the second current decreases. However, since the above laser drive device is provided with the third current source, the constant third current flows into one of the first and second transistors even when the value of the laser current is small. Thus, the switching speed of the first and second transistors is suppressed from decreasing even when the laser current is small.

Preferably, the above laser drive device further includes a first diode and a voltage application means. The first diode has an anode connected to the first current source and a cathode connected to the current amplifier. The voltage application means applies a predetermined voltage in the forward direction with respect to the first diode.

In the above laser drive device, with the placement of the first diode, reverse current flow from the current amplifier is prevented.

However, an intense reverse bias may undesirably be applied to the first diode. To avoid this occurrence in the laser drive device, it provides the voltage application means to apply a voltage on the first diode that is too low to turn ON in the forward direction with respect to the first diode.

The above form provides the following additional effect.

When the laser is OFF, that is, the first transistor is ON, the voltage at the node interconnecting the first transistor and the first current source decreases. This decrease is however only to the level of a voltage applied by the voltage application means. Therefore, when the first transistor is turned OFF next, the time required for the voltage at the interconnecting node to reach a predetermined level is shortened, compared with the case of having no voltage application means. That is, the switching speed can be made higher.

It is preferable that the voltage application means includes a fourth current source, m pieces of second diode, and a third transistor. The fourth current source supplies a fourth current. The m pieces of second diode are connected in series between the fourth current source and the cathode of the first diode. The third transistor has a collector connected to the power supply node, an emitter connected to the anode of the first diode, and a base connected to the fourth current source.

In the above laser drive device, a difference voltage between a dropped voltage at the m pieces of second diode due to the fourth current and a base-emitter voltage at the third transistor is applied in the forward direction to the first diode.

Preferably, the voltage application means further includes n pieces of third diode connected in series between the emitter of the third transistor and the anode of the first diode.

In the above laser drive device, the voltage that is applied in the forward direction to the first diode is lower by a dropped voltage at the n pieces of third diode than the difference voltage between a dropped voltage at the m pieces of second diode due to the fourth current and a base-emitter voltage at the third transistor. Therefore, the first diode can be turned OFF without fail even in the case where the first diode fails to be sufficiently turned OFF with the voltage applied thereto using only the m second diodes and the third transistor.

Preferably, the laser drive device further includes a fifth current source connected to the cathode of the first diode for receiving a fifth current.

If the fifth current source is not provided, the fourth current may be supplied to the current amplifier when the laser is OFF, that is, the first transistor is ON, possibly resulting in turning ON the laser.

In the above laser drive device, the entire fourth current or part of it flows into the fifth current source as the fifth current. Therefore, the above mentioned inconvenience can be avoided.

Preferably, the voltage application means further includes a resistor connected between the emitter of the third transistor and the anode of the first diode.

In the above laser drive device, a voltage is applied to the forward direction of the first diode that is lower by a value of a dropped voltage at the resistor than the difference voltage between a dropped voltage at the m pieces of second diode due to the fourth current and a base-emitter voltage at the third transistor. Therefore, the first diode can be turned OFF without fail even in the case where the first diode fails to be sufficiently turned OFF with the voltage applied thereto using only the m second diodes and the third transistor.

DESCRIPTION OF THE PREFERRED EMBODIMENTS

Figure 1:
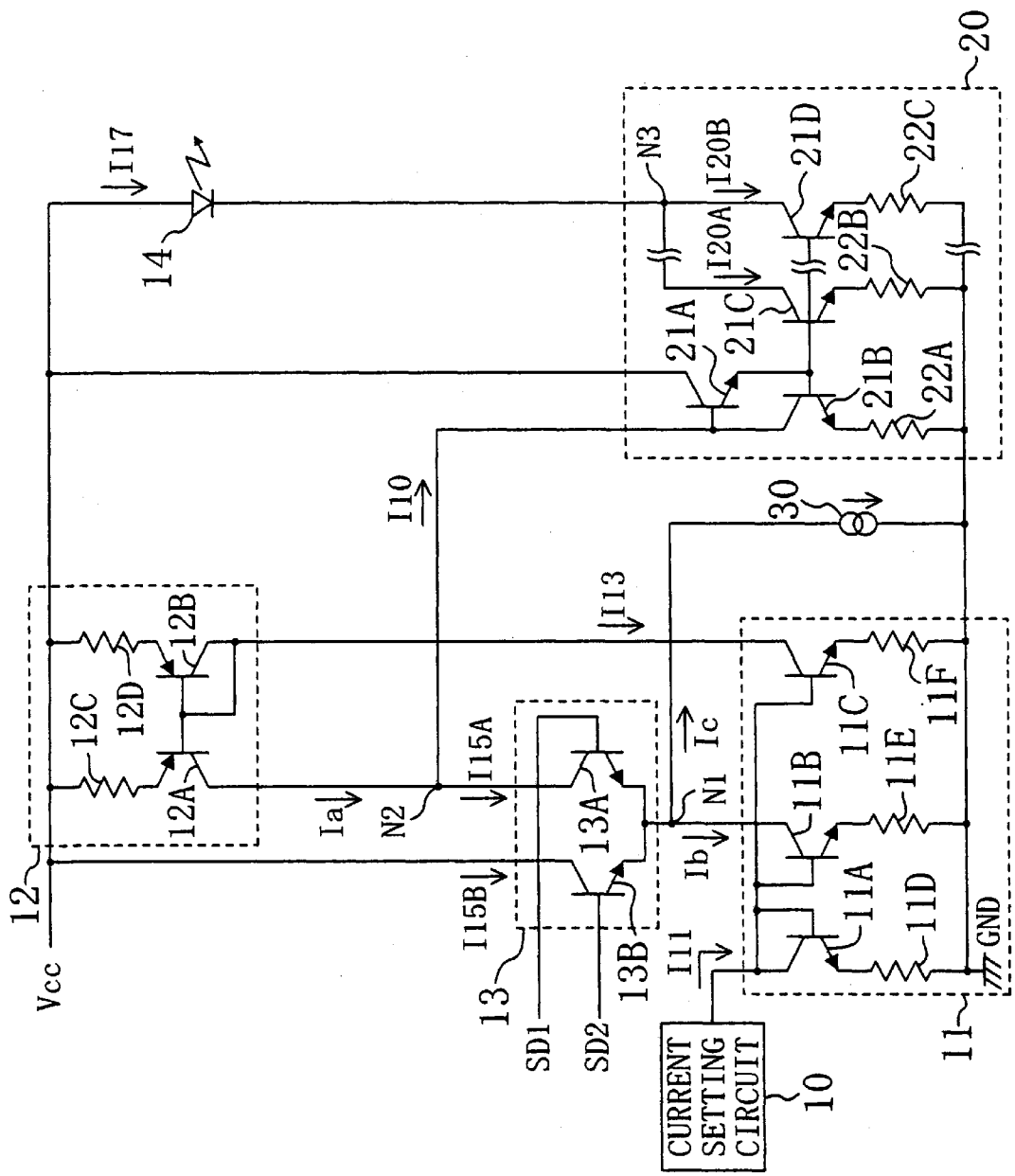
FIG. 1 is a view illustrating the overall form of a laser drive device of EMBODIMENT 1 of the present invention.

Hereinafter, preferred embodiments of the present invention will be described with reference to the accompanying drawings. In the drawings, the same or corresponding components are denoted by the same reference numerals, and the description on these components is not repeated.

Embodiment 1

FIG. 1 illustrates the overall form of the laser drive device of EMBODIMENT 1 according to the present invention. Referring to FIG. 1, the laser drive device of this embodiment includes a current setting circuit 10, an inflow-current source 11, an outflow-current source 12, a differential current switch 13, a laser 14, a current amplifier 20, and a constant current source 30.

The current setting circuit 10 generates a desired set current I11.

The inflow-current source 11 includes NPN transistors 11A through 11C and resistors 11D through 11F. The NPN transistor 11A has a collector connected to the output of the current setting circuit 10, an emitter connected to the resistor 11D, and a base connected to the collector of it. The NPN transistor 11B has a collector connected to a node N1, an emitter connected to the resistor 11E, and a base connected to the base of the NPN transistor 11A. The NPN transistor 11C has a collector connected to the outflow-current source 12, an emitter connected to the resistor 11F, and a base connected to the base of the NPN transistor 11A. The resistors 11D through 11F are connected between the emitters of the NPN transistors 11A through 11C, respectively, and a grounding node GND.

The outflow-current source 12 includes PNP transistors 12A and 12B and resistors 12C and 12D. The PNP transistor 12A has an emitter connected to the resistor 12C, a collector connected to a node N2, and a base connected to the base and collector of the PNP transistor 12B. The PNP transistor 12B has an emitter connected to the resistor 12D, a collector connected to the collector of the NPN transistor 11C of the inflow-current source 11, and a base connected to the collector of it.

The differential current switch 13 includes NPN transistors 13A and 13B. The NPN transistor 13A has a collector connected to the node N2, an emitter connected to the node N1, and a base receiving a signal SD1. The NPN transistor 13B has a collector connected to a power supply node Vcc, an emitter connected to the node N1, and a base receiving a signal SD2.

The current amplifier 20 includes NPN transistors 21A through 21D and resistors 22A through 22C. The NPN transistor 21A has a collector connected to the power supply node Vcc, an emitter connected to the base of the NPN transistor 21B, and a base connected to the collector of the NPN transistor 21B. The NPN transistor 21B has a collector connected to the node N2, an emitter connected to the resistor 22A, and a base connected to the emitter of the NPN transistor 21A. The NPN transistors 21C and 21D have respective collectors connected to a node N3, emitters connected to the resistors 22B and 22C, respectively, and respective bases connected to the base of the NPN transistor 21B. The resistors 22A through 22C are connected between the emitters of the NPN transistors 21B through 21D, respectively, and the grounding node GND.

The laser 14 has an anode connected to the power supply node Vcc and a cathode connected to the node N3.

The constant current source 30 is provided between the node N1 and the grounding node GND for allowing a current Ic to flow from the node N1 toward the grounding node GND.

The operation of the laser drive device with the above form will be described.

Figure 2:
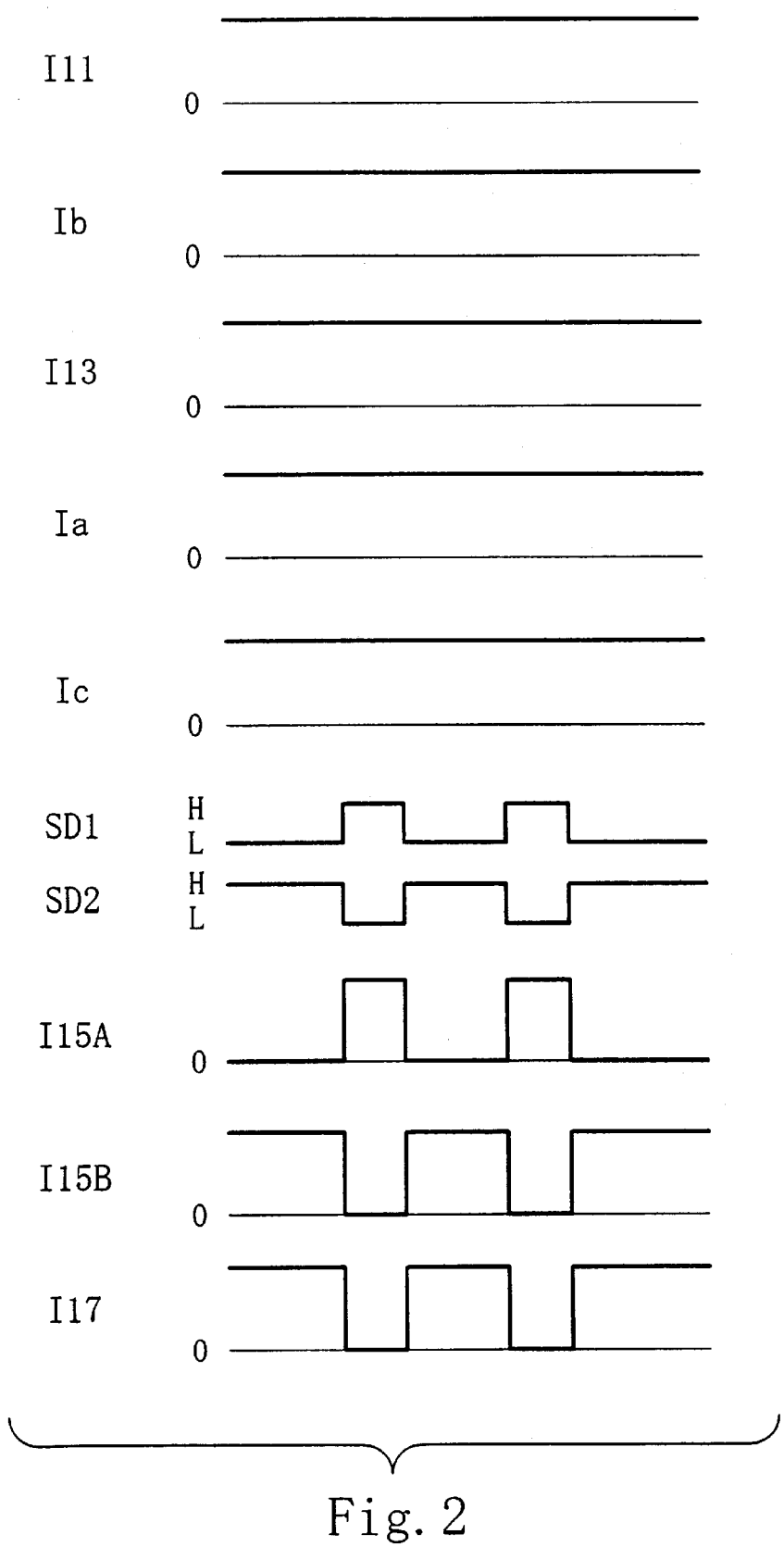
FIG. 2 is a timing chart for description of the operation of the laser drive device of FIG. 1.

FIG. 2 is a timing chart for describing the operation of the laser drive device shown in FIG. 1.

Referring to FIGS. 1 and 2, the set current I11 from the current setting circuit 10 is supplied to the collector and base of the NPN transistor 11A of the inflow-current source 11. The NPN transistors 11A and 11B make a current mirror circuit, so that an inflow-current Ib is determined by the set current I11 and the mirror ratio of the current mirror circuit. The NPN transistors 11A and 11C also make a current mirror circuit, so that an inflow-current I13 is determined by the set current I11 and the mirror ratio of this current mirror circuit.

The PNP transistors 12A and 12B of the outflow-current source 12 make a current mirror circuit, so that an outflow-current Ia is determined by the inflow-current I13 and the mirror ratio of this current mirror circuit. This means that the outflow-current Ia is determined by the set current I11. In this embodiment, it is assumed that the mirror ratios of the respective current mirror circuits are set so that the value of the outflow-current Ia is equal to the sum of the inflow-current Ib and the current Ic.

Signals SD1 and SD2 complementary to each other are applied to the bases of the transistors 13A and 13B, respectively, of the differential current switch 13.

When the laser 14 is to be turned ON, the signal SD1 is set to L (low) level and the signal SD2 is set to H (high) level. Here, the NPN transistor 13A is set to turn OFF and the NPN transistor 13B is set to turn ON, whereby the value of the current I15B flowing through the NPN transistor 13B is made equal to the sum of the value of the inflow-current Ib and the current Ic, while a current I15A flowing through the NPN transistor 13A is zero. As a result, a current I10 supplied to the current amplifier 20 is equal to the outflow-current Ia. In the current amplifier 20, the NPN transistors 21A through 21C make a current mirror circuit. Therefore, the current I10 flows through the NPN transistor 21B, and a current I20A of a value obtained by multiplying the current I10 by the mirror ratio of this current mirror circuit is induced at the NPN transistor 21C. The NPN transistors 21A, 21B, and 21D also make a current mirror circuit. Therefore, a current I20B of a value obtained by multiplying the current I10 by the mirror ratio of this current mirror circuit is induced at the NPN transistor 21D. The sum of the currents I20A and I20B is equal to a laser current I17 supplied to the laser 14. Thus, the laser 14 is turned ON. The relationship between the currents I10 and I17 is expressed by I17=I10×Ai in which Ai denotes the gain of the current amplifier 20.

When the laser 14 is to be turned OFF, the signal SD1 is turned to H level while the signal SD2 is turned to L level. This turns ON the NPN transistor 13A and turns OFF the NPN transistor 13B. Accordingly, the entire outflow-current Ia becomes the current I15A flowing through the NPN transistor 13A, and further becomes the inflow-current Ib and the current Ic. As a result, the current I10 supplied to the current amplifier 20 becomes zero, and thus the laser 14 is turned OFF.

When the laser drive device operating as described above is applied to an optical disk device, the values of the laser current I17 vary for writing, reading, and erasing of data on/from an optical disk. Overall, the value of the laser current I17 is large during writing, while it is small during reading. In the laser drive device of this embodiment, the values of the inflow-current Ib and the outflow-current Ia are adjusted by adjusting the value of the set current I11. Further, by the adjustment of the outflow-current Ia, the value of the laser current I17 is adjusted. In other words, a required value of the laser current I17 can be supplied to the laser 14 by adjusting the value of the set current I11 supplied from the current setting circuit 10.

In the laser drive device of this embodiment, which is provided with the current amplifier 20, the values of the outflow-current Ia and the inflow-current Ib are smaller than the value of the laser current I17. This makes it possible to suppress an increase in power consumed by the current setting circuit 10, the inflow-current source 11, the outflow-current source 12, and the differential current switch 13 even when the laser current I17 supplied to the laser 14 increases during writing of data on an optical disk, for example.

Overall, as a current flowing through a transistor is smaller, the switching speed of the transistor is lower. In the laser drive device of this embodiment, as the value of the laser current I17 supplied to the laser 14 is smaller, the value of the inflow-current Ib is smaller. However, since the laser drive device of this embodiment is provided with the constant current source 30, the constant current Ic flows through one of the NPN transistors 13A and 13B even when the value of the laser current I17 is small. Thus, the switching speed of the NPN transistors 13A and 13B can be suppressed from decreasing even when the laser current I17 supplied to the laser 14 is small.

In the above description, the value of the outflow-current Ia was set to be equal to the sum of the inflow-current Ib and the current Ic. Alternatively, part of the outflow-current Ia may be set to be equal to the sum of the inflow-current Ib and the current Ic. In this case, however, it is required that the value of the laser current I17 determined by the part of the outflow-current Ia supplied to the current amplifier 20 as the current I10 is smaller than a threshold value of the laser 14.

Alternatively, a plurality of additional NPN transistors and resistors may be provided between a node N3 and the grounding node GND in parallel with the NPN transistors 21C and 21D and the resistors 22B and 22C. With this form, the gain of the current amplifier 20 can be adjusted to a desired value.

Figure 3:
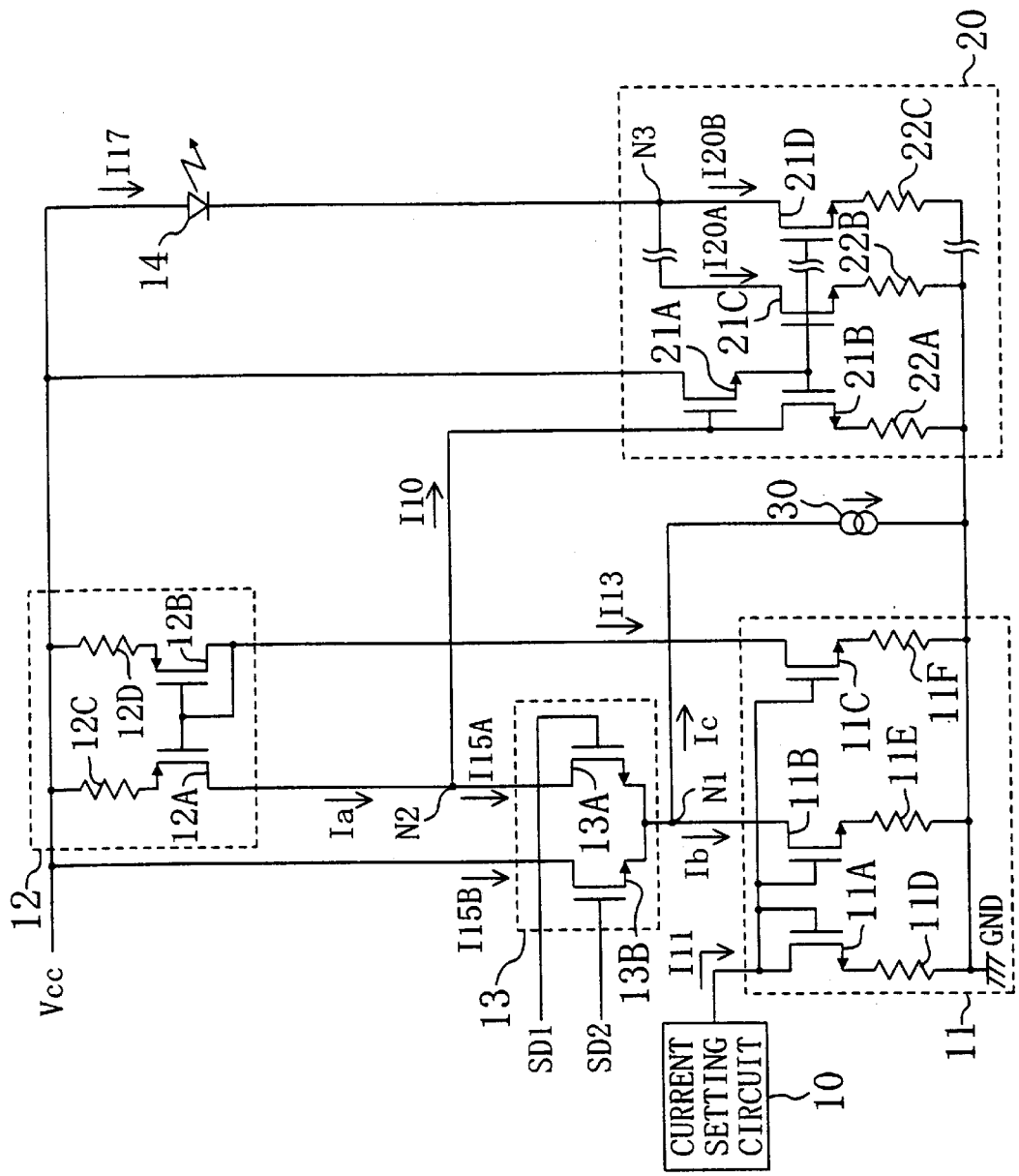
FIG. 3 is a view illustrating an alternation of the laser drive device of FIG. 1.

FIG. 3 illustrates another laser drive device of this embodiment, where n-channel and p-channel MOS transistors are used in place of the NPN and PNP transistors. Specifically, n-channel MOS transistors 11A through 11C may be used in place of the NPN transistors 11A through 11C of the inflow-current source 11, p-channel MOS transistors 12A and 12B in place of the PNP transistors 12A and 12B of the outflow-current source 12, n-channel MOS transistors 13A and 13B in place of the NPN transistors 13A and 13B of the differential current switch 13, and n-channel MOS transistors 21A through 21D in place of the NPN transistors 21A through 21D of the current amplifier 20.

Embodiment 2

Figure 4:
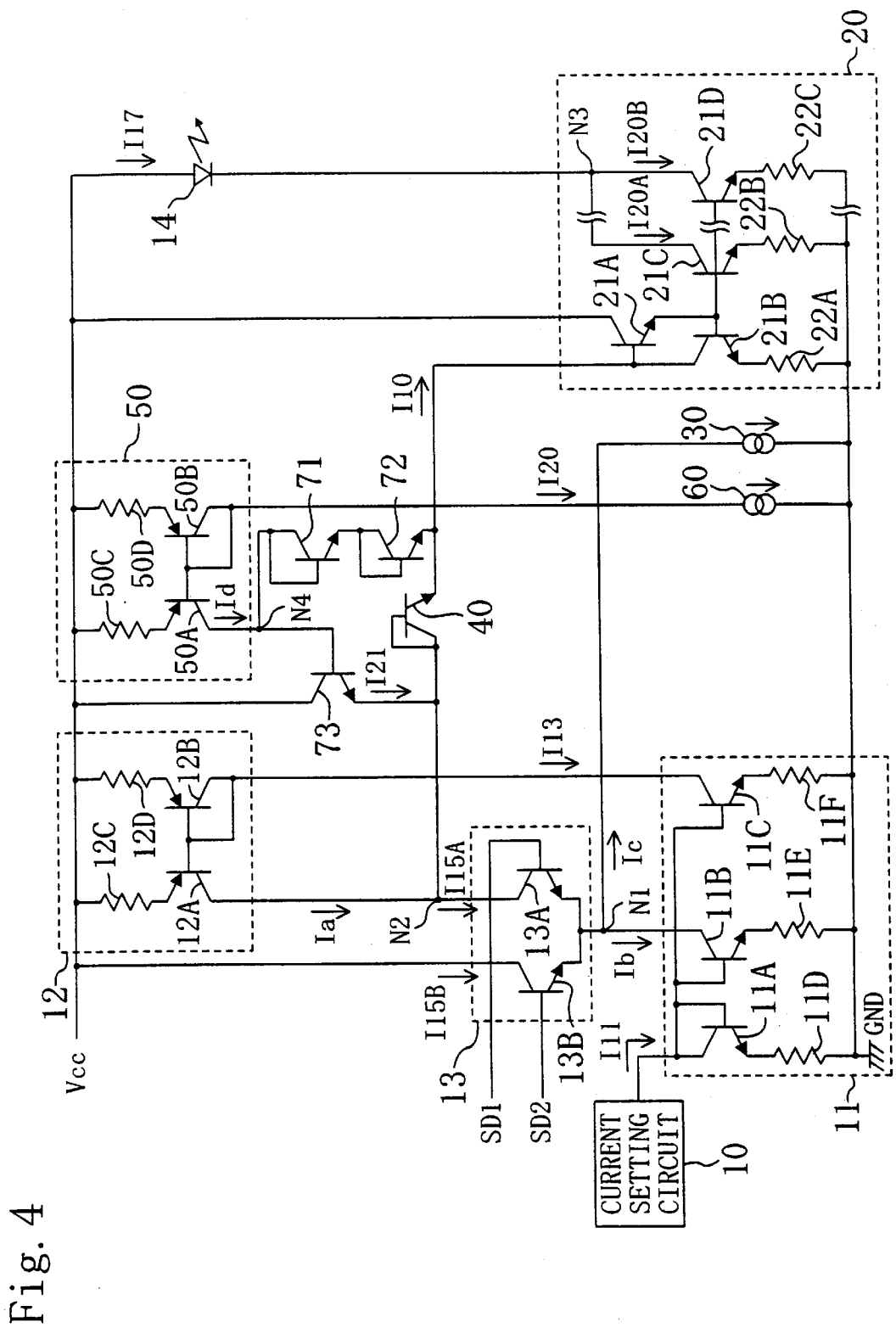
FIG. 4 is a view illustrating the overall form of a laser drive device of EMBODIMENT 2 of the present invention.

FIG. 4 illustrates the overall form of the laser drive device of EMBODIMENT 2 according to the present invention. The laser drive device of this embodiment shown in FIG. 4 includes, in addition to the components of the laser drive device shown in FIG. 1, a reverse flow prevention diode 40, an outflow-current source 50, a constant current source 60, clamping diodes 71 and 72, and a clamping transistor 73. The outflow-current source 50, the constant current source 60, the clamping diodes 71 and 72, and the clamping transistor 73 make a voltage application means.

The reverse flow prevention diode 40 is an NPN transistor of which collector and base are connected with each other, where the collector and the base make an anode while the emitter makes a cathode. The anode is connected to the node N2, while the cathode is connected to the collector of the NPN transistor 21B of the current amplifier 20.

The outflow-current source 50 includes PNP transistors 50A and 50B and resistors 50C and 50D. The PNP transistor 50A has an emitter connected to the resistor 50C, a collector connected to a node N4, and a base connected to the base and collector of the PNP transistor 50B. The PNP transistor 50B has an emitter connected to the resistor 50D, a collector connected to the constant current source 60, and a base connected to the collector of it. The resistors 50C and 50D are connected between the power supply node Vcc and the emitters of the PNP transistors 50A and 50B, respectively.

The constant current source 60 is provided between the collector of the PNP transistor 50B and the grounding node GND for allowing a current I20 to flow from the collector of the PNP transistor 50B toward the grounding node GND.

Each of the clamping diodes 71 and 72 is an NPN transistor of which collector and base are connected with each other, where the collector and the base make an anode while the emitter makes a cathode. The anode of the clamping diode 71 is connected to the node N4, while the cathode of it is connected to the anode of the clamping diode 72. The cathode of the clamping diode 72 is connected to the cathode of the reverse flow prevention diode 40.

The clamping transistor 73 has a collector connected to the power supply node Vcc, an emitter connected to the anode of the reverse flow prevention diode 40, and a base connected to the node N4.

The operation of the laser drive device with the above form will be described.

Figure 5:
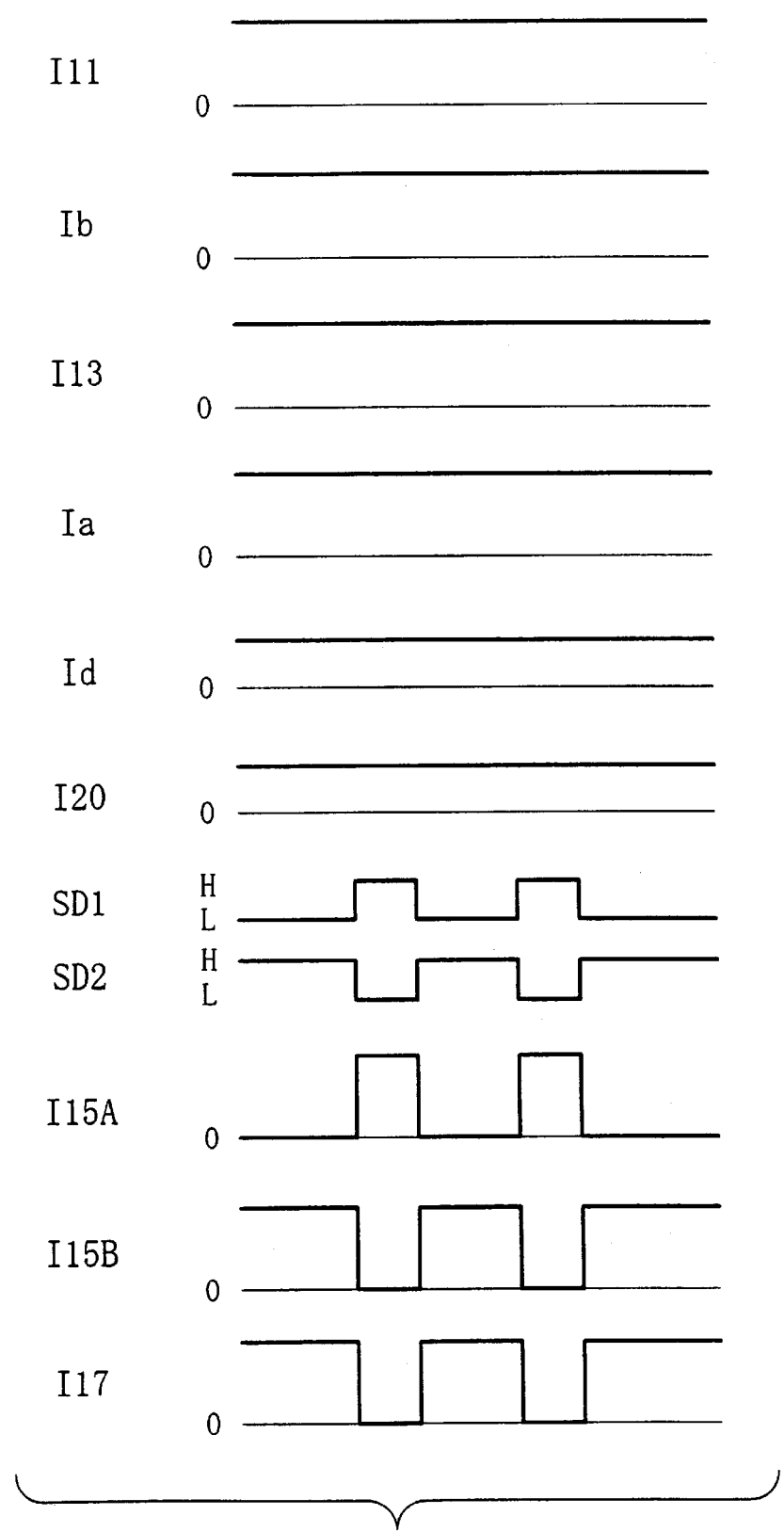
FIG. 5 is a timing chart for description of the operation of the laser drive device of FIG. 4.

FIG. 5 is a timing chart for describing the operation of the laser drive device shown in FIG. 4.

Referring to FIGS. 4 and 5, when the laser 14 is to be turned ON, the signal SD1 is turned to L level while the signal SD2 is turned to H level. This turns OFF the NPN transistor 13A and turns ON the NPN transistor 13B, whereby the current I15B flowing through the NPN transistor 13B is made equal to the sum of the inflow-current Ib and the current Ic, while the current I15A flowing through the NPN transistor 13A becomes zero. As a result, the current I10 supplied to the current amplifier 20 is equal to the sum of the outflow-current Ia, a current I21, and an outflow-current Id. Thus, the laser 14 is turned ON.

When the laser 14 is to be turned OFF, the signal SD1 is turned to H level while the signal SD2 is turned to L level. This turns ON the NPN transistor 13A and turns OFF the NPN transistor 13B, by which the outflow-current Ia and the current I21 become the current I15A flowing through the NPN transistor 13A, and further become the inflow-current Ib and the current Ic. As a result, the current I10 supplied to the current amplifier 20 is equal to the outflow-current Id, which is too low in a level to influence the ON/OFF of the laser 14. Thus, the laser 14 is turned OFF.

Since the laser drive device of this embodiment is provided with the reverse flow prevention diode 40, reverse current flow from the current amplifier 20 toward the node N2 is prevented. However, an intense reverse bias may undesirably be applied to the reverse flow prevention diode 40. To avoid this occurrence, the voltage application means is provided.

The NPN transistors 50A and 50B of the outflow-current source 50 make a current mirror circuit, so that the outflow-current Id that flows through the PNP transistor 50A is determined by the constant current I20 and the mirror ratio of this current mirror circuit. The voltage level at the node N4 is higher than that at the cathode of the reverse flow prevention diode 40 by a value corresponding to the dropped voltage at the clamping diodes 71 and 72 caused by the outflow-current Id. The voltage at the node N4 is applied to the base of the clamping transistor 73, to allow the current I21 to flow. Therefore, the voltage level at the anode of the reverse flow prevention diode 40 is lower than that at the node N4 by a value corresponding to the base-emitter voltage at the clamping transistor 73. In this way, a voltage that is too low to turn ON the reverse flow prevention diode 40 is applied in the forward direction with respect to the reverse flow prevention diode 40.

The laser drive device of this embodiment with the above form provides the following additional effect.

When the laser 14 is to be turned OFF, the NPN transistor 13A is turned ON, by which the outflow-current Ia and the current I21 become the current I15A flowing through the NPN transistor 13A, and further become the inflow-current Ib and the current Ic. This reduces the voltage level at the node N2. This reduction is however only to the level equal to that of the voltage at the anode of the reverse flow prevention diode 40 applied by the voltage application means. Therefore, when the NPN transistor 13A is turned OFF next, the time required for the voltage level at the node N2 to reach a predetermined level is shortened, compared with the case of having no voltage application means. That is, the switching speed of the NPN transistors 13A and 13B is made higher.

In this embodiment, two clamping diodes, 71 and 72, were used. The number of the clamping diodes is not limited, but any number of clamping diodes required for application of a voltage too low to turn ON the reverse flow prevention diode 40 can be provided.

Embodiment 3

Figure 6:
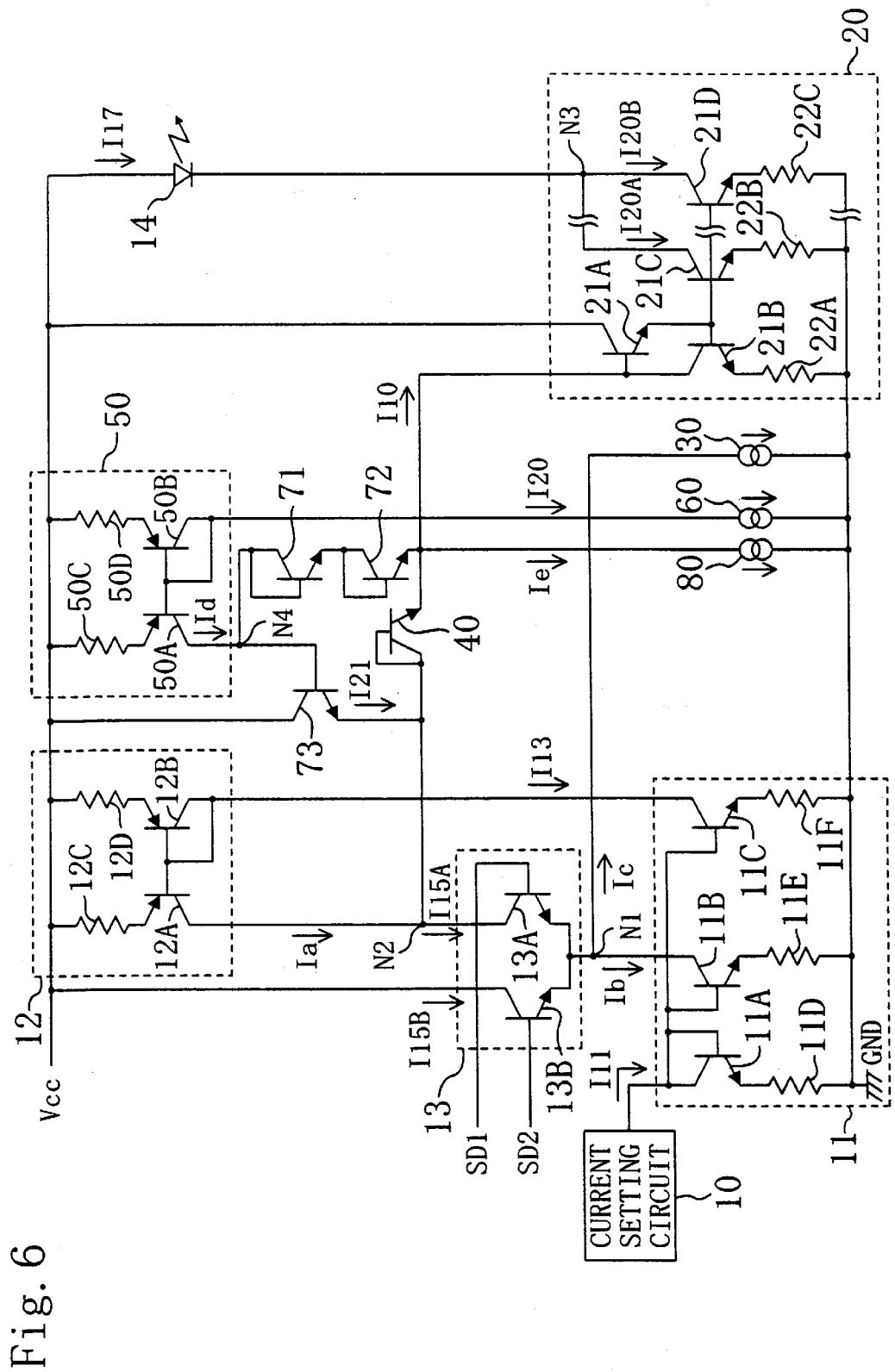
FIG. 6 is a view illustrating the overall form of a laser drive device of EMBODIMENT 3 of the present invention.

FIG. 6 illustrates the overall form of the laser drive device of EMBODIMENT 3 according to the present invention. The laser drive device of this embodiment shown in FIG. 6 includes a constant current source 80, in addition to the components of the laser drive device shown in FIG. 4. The constant current source 80 is provided between the cathode of the reverse flow prevention diode 40 and the grounding node GND for allowing a constant current Ie to flow from the cathode of the reverse flow prevention diode 40 toward the grounding node GND.

In the laser drive device shown in FIG. 4, the outflow-current Id is supplied to the current amplifier 20 when the laser 14 is to be turned OFF. If the value of the laser current I17 obtained by amplifying the outflow-current Id exceeds the threshold value of the laser 14, the laser 14 will be turned ON.

In the laser drive device of this embodiment shown in FIG. 6, the outflow-current Id is drawn by the constant current Ie, so that the laser 14 is prevented from being turned ON when the laser 14 should be in the OFF state.

Embodiment 4

Figure 7:
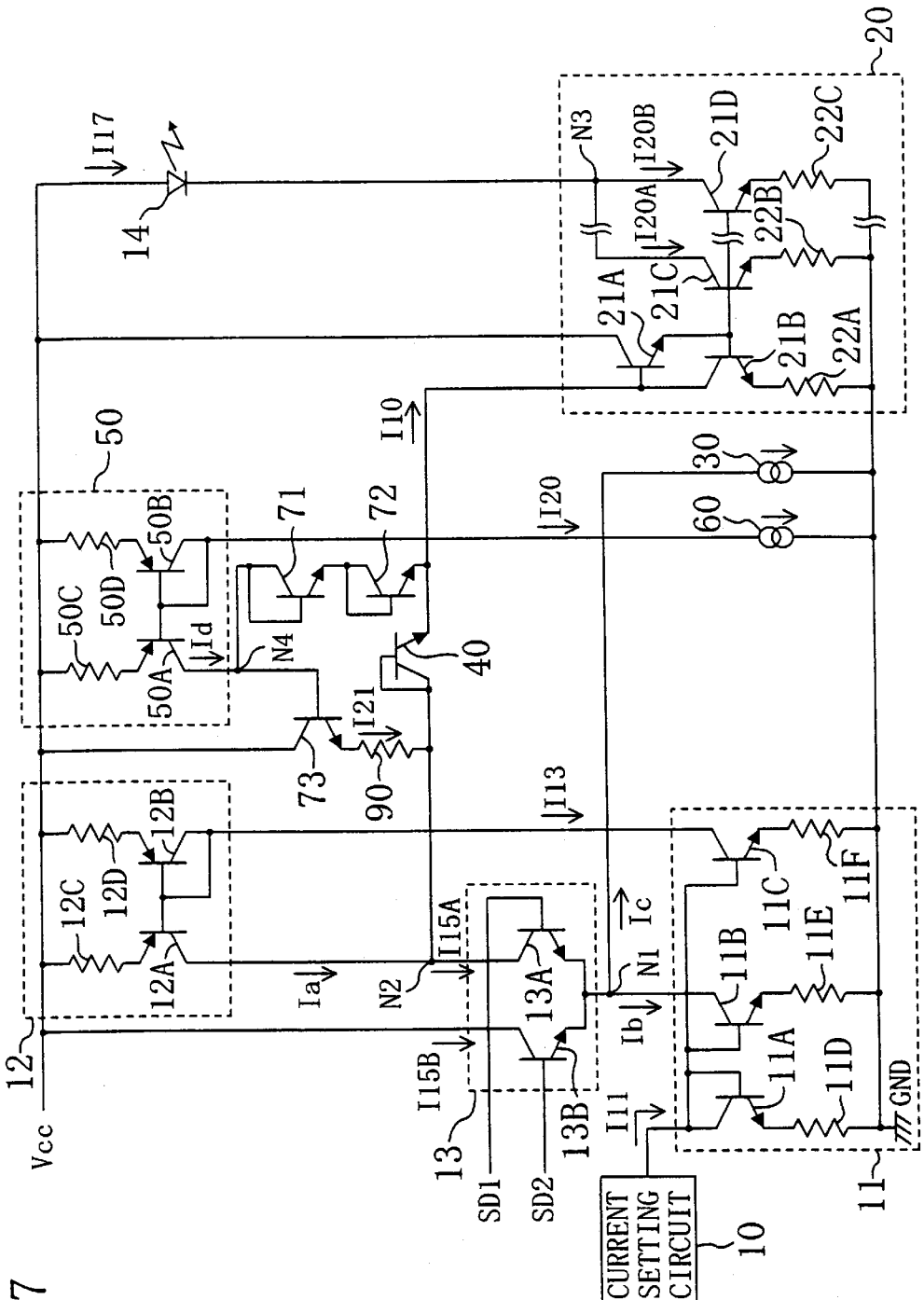
FIG. 7 is a view illustrating the overall form of a laser drive device of EMBODIMENT 4 of the present invention.

FIG. 7 illustrates the overall form of the laser drive device of EMBODIMENT 4 according to the present invention. The laser drive device of this embodiment shown in FIG. 7 includes a resistor 90, in addition to the components of the laser drive device shown in FIG. 4. The resistor 90 is connected between the emitter of the clamping transistor 73 and the anode of the reverse flow prevention diode 40.

In the laser drive device shown in FIG. 4, the voltage level at the anode of the reverse flow prevention diode 40 may not be lowered sufficiently, thereby failing to turn off the reverse flow prevention diode 40 sufficiently. In such an occurrence, the current I21 may presumably be partly supplied to the current amplifier 20 resulting in turning ON the laser 14.

In the laser drive device of this embodiment shown in FIG. 7, the voltage level at the anode of the reverse flow prevention diode 40 can be reduced by a value corresponding to a dropped voltage caused by the resistor 90. As a result, the reverse flow prevention diode 40 can be turned OFF without fail.

In this embodiment, the resistor 90 was provided. Alternatively, a diode may be provided between the emitter of the clamping transistor 73 and the anode of the reverse flow prevention diode 40.

In place of the resistor 90, also, a plurality of diodes connected in series may be provided between the emitter of the clamping transistor 73 and the anode of the reverse flow prevention diode 40.

Embodiment 5

Figure 8:
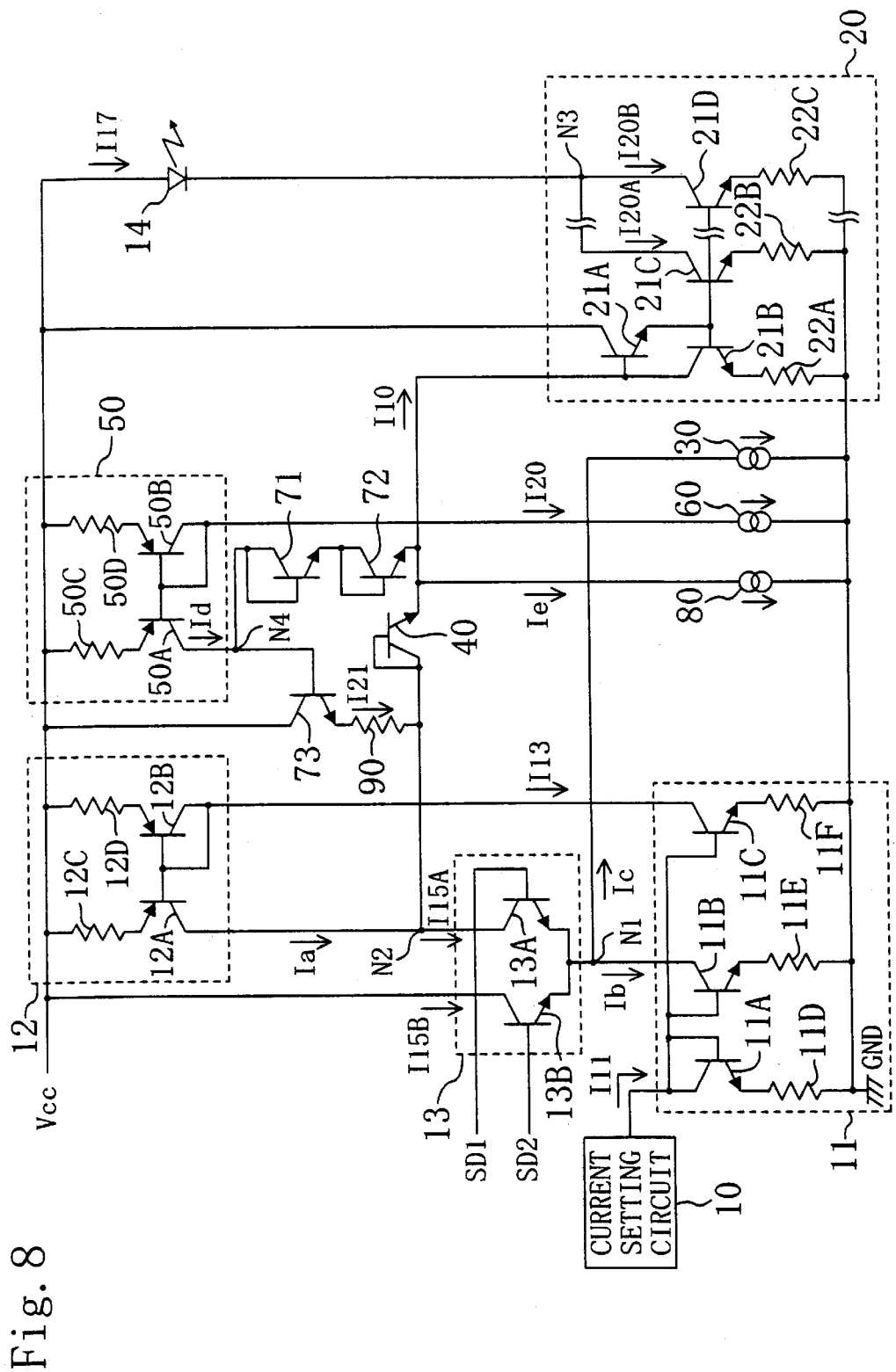
FIG. 8 is a view illustrating the overall form of a laser drive device of EMBODIMENT 5 of the present invention.
Figure 9:
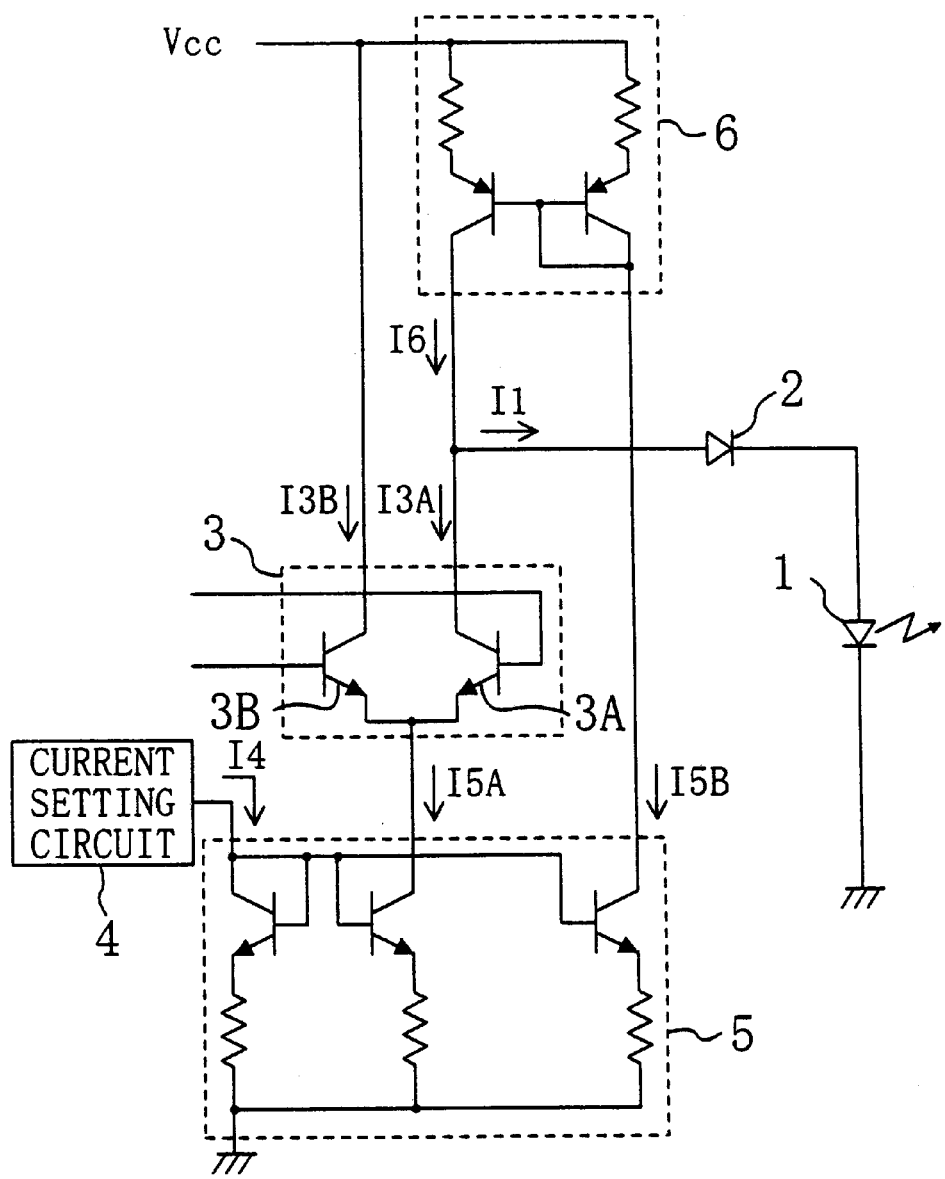
FIG. 9 is a view illustrating the overall form of a conventional laser drive device.

FIG. 8 illustrates the overall form of the laser drive device of EMBODIMENT 5 according to the present invention. The laser drive device of this embodiment shown in FIG. 8 includes, in addition to the components of the laser drive device shown in FIG. 1, the reverse flow prevention diode 40, the outflow-current source 50, the constant current source 60, the clamping diodes 71 and 72, and the clamping transistor 73 shown in FIG. 4, the constant current source 80 shown in FIG. 6, and the resistor 90 shown in FIG. 7.

In the laser drive device of this embodiment, when the laser 14 is to be turned ON, the signal SD1 is turned to L level while the signal SD2 is turned to H level. This turns OFF the NPN transistor 13A and turns ON the NPN transistor 13B, whereby the current I15B flowing through the NPN transistor 13B is made equal to the sum of the inflow-current Ib and the current Ic, while the current I15A flowing through the NPN transistor 13A becomes zero. As a result, the current I10 supplied to the current amplifier 20 is equal to the sum of the outflow-current Ia, the current I21, the outflow-current Id, and the inflow-current Ie. The laser current I17 is generated by the voltage amplifier 20 based on the current I10, and supplied to the laser 14 to turn ON the laser 14.

When the laser 14 is to be turned OFF, the signal SD1 is turned to H level while the signal SD2 is turned to L level. This turns ON the NPN transistor 13A and turns OFF the NPN transistor 13B, by which the outflow-current Ia and the current I21 become the current I15A flowing through the NPN transistor 13A, and further become the inflow-current Ib and the current Ic. The current Id is drawn by the constant current Ie. Thus, the laser 14 is turned OFF.

In the laser drive device of this embodiment, since the current amplifier 20 is provided, the values of the outflow-current Ia and the inflow-current Ib are smaller than the value of the laser current I17. This makes it possible to suppress an increase in power consumed by the current setting circuit 10, the inflow-current source 11, the outflow-current source 12, and the differential current switch 13 even when the laser current I17 supplied to the laser 14 increases during writing of data on an optical disk, for example.

Since the constant current source 30 is provided, the constant current Ic flows through the NPN transistors 13A and 13B even when the value of the laser current I17 is small. This makes it possible to suppress decrease in the switching speed of the NPN transistors 13A and 13B even when the laser current I17 supplied to the laser 14 is small.

Since the voltage application means is provided, the reverse flow prevention diode 40 is prevented from receiving an intense reverse bias. In addition, the switching speed of the NPN transistors 13A and 13B is made higher compared with the case of providing no voltage application means.

Since the constant current source 80 is provided, the laser 14 is prevented from being turned ON when it should be in the OFF state.

Since the resistor 90 is provided, the OFF state of the reverse flow prevention diode 40 is ensured.

It should be note that the laser drive devices of EMBODIMENTS 1 through 5 described above are operable if the connection polarity at the laser 14 is changed and the PNP transistors and the NPN transistors are exchanged with each other.

While the present invention has been described in a preferred embodiment, it will be apparent to those skilled in the art that the disclosed invention may be modified in many ways and may assume many embodiments other than that specifically set out and described above. Accordingly, it is intended by the appended claims to cover all modifications of the invention which fall within the true spirit and scope of the invention.

What is claimed is:

1. A laser drive device comprising:
   a terminal being connected to a laser;
   a first current source for supplying a first current having a current value associated with a set current value;
   a second current source for receiving a second current having a current value associated with the set current value;
   a current amplifier for amplifying a current from the first current source to generate a laser current and supplying the laser current to the laser;
   a first electrical switch connected between the first current source and the second current source; and
   a second electrical switch connected between a power supply node receiving a power supply voltage and the second current source, the second electrical switch being turned ON/OFF complementarily to the first electrical switch.

2. The laser drive device of claim 1, wherein at least one of said first electrical switch and said second electrical switch includes a transistor.

3. The laser drive device of claim 1, further comprising a third current source being connected to the connected portion of said first and second electrical switch with the second current source.

4. The laser drive device of claim 1, wherein each of said first electrical switch and said second electrical switch includes a transistor.

* * * * *